United States Patent
Hepler et al.

(10) Patent No.: US 6,961,921 B2
(45) Date of Patent: Nov. 1, 2005

(54) PIPELINE ARCHITECTURE FOR MAXIMUM A POSTERIORI (MAP) DECODERS

(75) Inventors: Edward L. Hepler, Malvern, PA (US); Michael F. Starsinic, Philadelphia, PA (US)

(73) Assignee: Interdigital Technology Corporation, Wilmington, DE (US)

( * ) Notice: Subject to any disclaimer, the term of this patent is extended or adjusted under 35 U.S.C. 154(b) by 652 days.

(21) Appl. No.: 10/037,609

(22) Filed: Jan. 2, 2002

(65) Prior Publication Data

US 2003/0066019 A1 Apr. 3, 2003

Related U.S. Application Data

(60) Provisional application No. 60/317,855, filed on Sep. 6, 2001.

(51) Int. Cl.[7] .............................................. H03M 13/03
(52) U.S. Cl. ...................................... 716/796; 714/791
(58) Field of Search ................................. 714/796, 780, 714/785, 791, 786

(56) References Cited

U.S. PATENT DOCUMENTS

| | | | | |
|---|---|---|---|---|
| 5,148,385 A | | 9/1992 | Frazier .................. 364/728.07 |
| 5,208,816 A | | 5/1993 | Seshardi et al. ............ 714/786 |
| 5,263,026 A | | 11/1993 | Parr et al. .................. 370/95.1 |
| 5,381,425 A | | 1/1995 | Bitzer et al. ................. 714/786 |
| 5,450,453 A | | 9/1995 | Frank .......................... 375/210 |
| 6,222,406 B1 | | 4/2001 | Noda et al. |
| 6,343,368 B1 | * | 1/2002 | Lerzer ........................ 714/796 |
| 6,452,979 B1 | * | 9/2002 | Ariel et al. ................. 375/265 |
| 6,563,877 B1 | * | 5/2003 | Abbaszadeh ................ 375/242 |
| 6,725,409 B1 | * | 4/2004 | Wolf ........................... 714/755 |
| 6,754,290 B1 | * | 6/2004 | Halter ......................... 375/340 |
| 6,757,865 B1 | * | 6/2004 | Nakamura et al. .......... 714/796 |
| 6,813,743 B1 | * | 11/2004 | Eidson ........................ 714/795 |
| 6,829,313 B1 | * | 12/2004 | Xu .............................. 375/341 |

\* cited by examiner

*Primary Examiner*—Albert Decady
*Assistant Examiner*—Esaw Abraham
(74) *Attorney, Agent, or Firm*—Volpe and Koenig, P.C.

(57) ABSTRACT

The sliding window approach to pipeline maximum a posteriori (MAP) decoder architecture is modified to decrease processing time. Once the forward metrics have been calculated for the first sliding window of the decoder, the reverse metrics for each window are calculated while the forward metrics for the next window are calculated. As each new forward metric is calculated and stored into memory, the forward metric from the previous window is read from memory for use with reverse metric being calculated in calculating extrinsic value. Each forward metric for use in calculating an extrinsic value is read from memory on the same clock edge that the new forward metric is written to the same memory location. Although this architecture was developed for a turbo decoder, all convolution codes can use the MAP algorithm of the present invention.

39 Claims, 3 Drawing Sheets

PIPELINE ARCHITECTURE FOR MAXIMUM A POSTERIORI (MAP) DECODERS

FIELD OF THE INVENTION

The present invention relates to the field of processing error detection and correction algorithms. More specifically, the present invention relates to an efficient pipelined architecture for processing maximum a posteriori (MAP) algorithms.

BACKGROUND OF THE INVENTION

Some error correction algorithms, such as the Turbo Decoder algorithm, use variations of the MAP algorithm to recover a sequence of information bits from an encoded bit sequence that has been corrupted by noise. The recursive nature of the calculation required by the MAP algorithm makes implementation costly.

For example, FIG. 1 illustrates the sequence output by the MAP algorithm as a function of a set of "forward" metrics, and a set of "backward" metrics. However, each forward metric $\alpha(k)$, is a function of the previous forward metric, $\alpha(k-1)$ and each reverse metric $\beta(k-1)$, is a function of the next reverse metric, $\beta(k)$. As illustrated in the timeline diagram of FIG. 1, an architecture that implements this algorithm requires a buffer large enough to hold either all of the forward metrics or all of the reverse metrics such that the other set of metrics can be calculated while the output is calculated, which design leads to a decoder whose latency is proportional to approximately twice the size of the block that needs to be decoded.

In an effort to reduce the buffer required by the MAP algorithm, a modified version of the MAP algorithm, called the sliding window algorithm, has been developed. By making a small approximation in the reverse metric calculations, the sliding window approach reduces the size of the required metric buffer. This is accomplished by dividing the received sequence into windows, and then processing each window.

FIG. 2 illustrates a timeline of how the sliding window calculations are performed when the data has been divided into two windows. The length of the tail and learn size are typically very small compared to the amount of data to be processed. It is clear that as long as the window size is relatively large compared to the size of the learning window, the latency through the decoder is not significantly increased but the size of the buffer required to hold the forward metric is significantly decreased.

Therefore, an objective of the present invention is to reduce both latency and cost associated with implementing such algorithms.

SUMMARY OF THE INVENTION

In the pipelined MAP decoder architecture of the present invention, the sliding window approach is modified so that processing time can be decreased. Once the forward metrics have been calculated for the first window, the reverse metrics for each window are calculated while the forward metrics for the next window are calculated. As each new forward metric is calculated and stored into memory, the forward metric from the previous window is read from memory so that the new reverse metric can be calculated. Each forward metric from the previous window is read from memory on the same clock edge that the new forward metric for the next window is written to the same memory location. By reading and writing the forward metrics to memory in this manner, the size of the forward metric buffer does not need to be increased. The pipelined calculations may also be performed if the data is divided into two windows. Although this architecture was developed for a Turbo Decoder, any decoder that uses a version of the MAP algorithm can use it. The pipelined sliding window architecture decreases processing time. The standard sliding window architecture would need to run at a significantly higher clock rate to achieve the same throughput.

BRIEF DESCRIPTION OF THE DRAWINGS

The present invention will hereinafter be described in conjunction with the appended drawing figures, wherein like numerals designate like elements and.

DETAILED DESCRIPTION OF THE DRAWINGS

Figure 4:
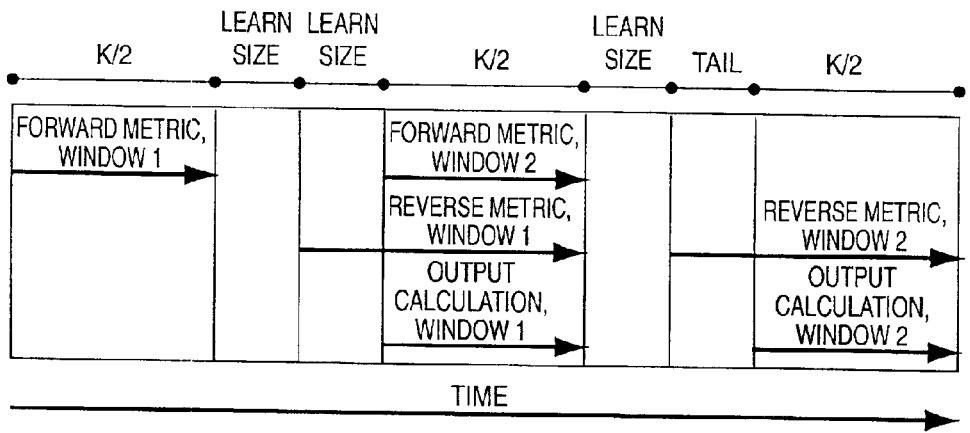
FIG. 4 is a time line of the error correction architecture of the present invention.
Figure 3:
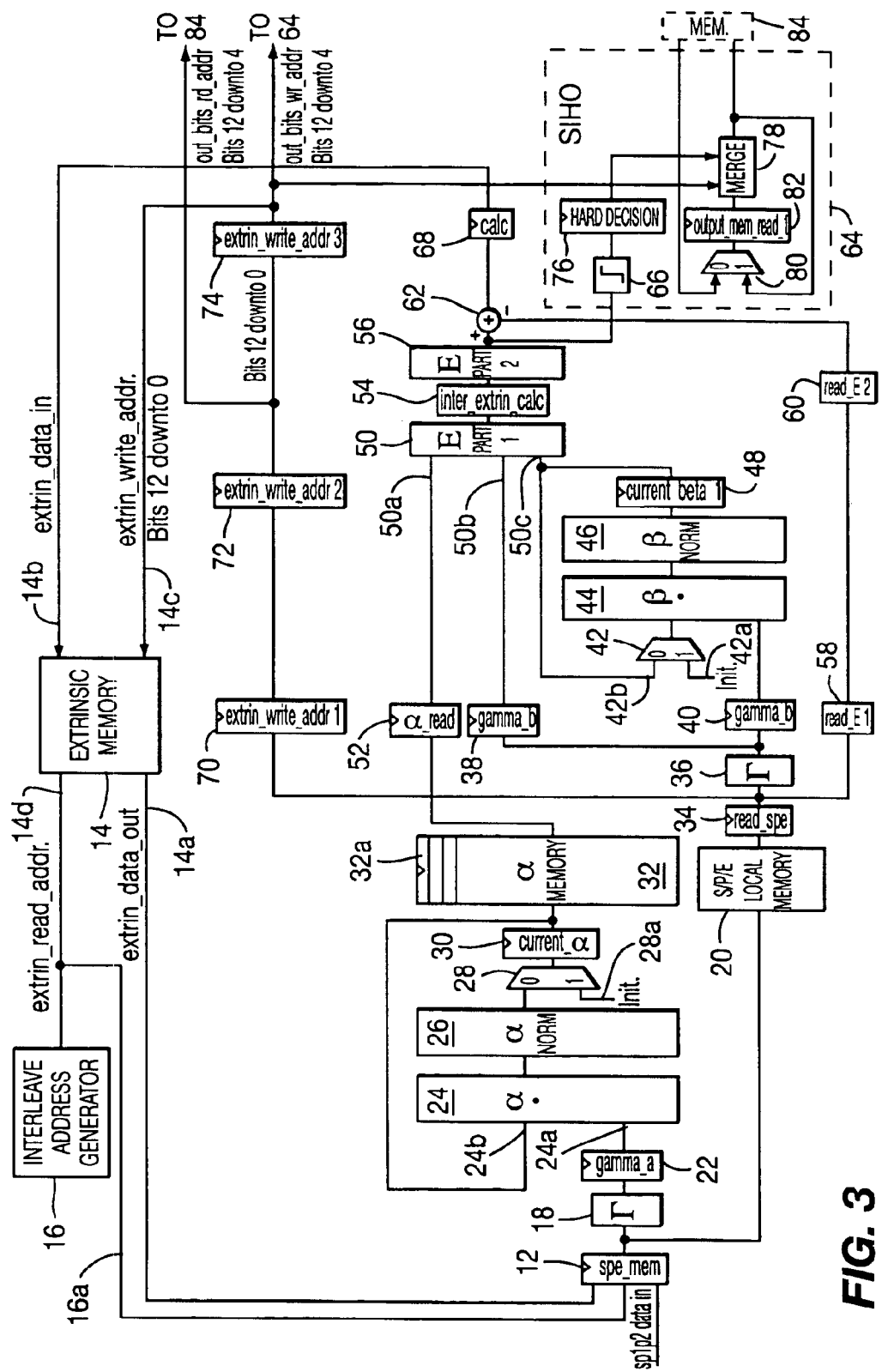
FIG. 3 is a block diagram of a turbo decoder in which the error correction architecture of the present invention may reside.

FIG. 3 of the present invention is a block diagram of a turbo Decoder in which the pipeline decoder architecture of the present invention may reside. In the pipelined MAP decoder architecture of the present invention, the sliding window approach is modified so that processing time can be decreased. FIG. 4 illustrates the timeline accomplished by the present invention. Once the forward metrics have been calculated for the first window, the reverse metrics for each window are calculated while the forward metrics for the next window are calculated. As each new forward metric is calculated and stored into memory, the forward metric from the previous window is read from memory so that the new reverse metric can be calculated. Each forward metric is read from memory on the same clock edge that the new forward metric is written to the same memory location. By reading and writing the forward metrics to memory in this manner, the size of the forward metric buffer does not need to be increased.

FIG. 3 shows a block diagram of one embodiment of a turbo decoder incorporating the principles and or techniques of the present invention.

The turbo decoder 10 receives data from a transmitting facility such as, for example, a base station which converts each data bit ("1" or "0") into three bits, namely a data or systematic bit(s), a first parity bit (p1) and a second parity bit (p2). The sp1p2 data is applied to a register 12 which also receives extrinsic data read out from an extrinsic memory 14, to be more fully described, hereinbelow, and an address obtained from interleave address register 16. Memory register 12 thus initially receives and stores the sp1p2 data, the extrinsic data appearing at line 14a and an address at which the extrinsic data is located, at line 16a. The address accompanies the sp1p2 data throughout the calculations for a purpose to be more fully described hereinbelow.

The sp1p2 data is transferred from register 12 to gamma ($\gamma$) calculator 18 and is further stored in local memory 20.

As is conventional in turbo decoders, three quantities, alpha (α), beta (β) and gamma (γ) are defined. For a specific state and a specific time step, α has a value that defines the probability that the coder is at that state at that specific time step. Alpha is derived recursively starting from time k=1 and moving forward in time. The value β is similar to α but works backwards in time. Gamma (γ) is defined as the transition probability that the coder will move from a state at a given time to some allowed state at the next subsequent time increment. Alpha (α) can be calculated for all states in a trellis based on the state transition probabilities represented by gamma (γ). The gamma (γ) calculation performed at stage 18 is stored in register 22. Calculation stages 24 and 26 respectively calculate each alpha and normalize the alpha calculations. Each alpha (α) value is calculated based on the input from register 22 as well as the previously calculated alpha value provided at input 24b and outputted from calculation stage 26 through multiplexer 28 and register 30, which holds eight (8) calculated values. The output of register 30 is coupled to the input of alpha memory 32 which stores the first calculated alpha value at the first memory location 32a and also provides the calculated alpha value to input 24b.

In order to initialize the calculation and, starting at the initial state, the initial eight (8) alpha metrics are set to some initial value, which is applied at the initialized input 28a of multiplexer 28 in order to enable the calculation stages 24 and 26 to calculate the eight (8) values for alpha. As was mentioned hereinabove, the sp1p2 data is stored in local memory 20.

Initially, all of the alpha values are calculated, whereupon the beta values are calculated by utilization of the sp1p2 data which are read in reverse order from local memory 20 (i.e., "last-in, first-out order") in order to perform the calculations required for the backwards recursive formula for beta. The sp1p2 data last read in local memory 20 is read into register 34, which contains not only the sp1p2 data, but the extrinsic value (which in the initial stage operation is 0), as well as the data representing the memory location in which the initial extrinsic value located in the extrinsic memory 14. The sp1p2 an extrinsic data undergo calculation at gamma calculation stage 36. The output of the gamma calculation stage 36 is applied to gamma registers 38 and 40. The beta calculations are respectively performed by beta calculation stage 44 and beta normalization stage 46. Initially, a start condition of binary one ("1") is applied to input 42a of multiplexer 42. The normalized beta calculation is initially applied to extrinsic value calculation stage 50 through output register 48 which further applies the last calculated input to input 42b of multiplexer 42. Extrinsic value calculator stage 50 calculates an extrinsic value for each time state k by looking at the alpha value for register 52 received at input 50a, the gamma value from register 38 received at input 50b and the beta output from register 48 received at input 50c. Registers 48, 52 and 38 are provided to assure time registration of the signals at the extrinsic value calculator stage 50.

The intermediate value calculated by first value extrinsic calculator stage 50 is applied to register 54 which transfers its contents to the second stage 56 of the extrinsic value calculator.

As was mentioned hereinabove, register 34 transfers its contents to register 58 which in turn transfers its contents to register 60, the contents of register 60 being subtracted from the extrinsic value appearing at the output of the second extrinsic value calculation stage 56, this subtraction stage being performed at the subtraction circuit 62.

The extrinsic value obtained at stage 56 is further applied to a soft-in-hard-out (SIHO) circuitry 64 comprised of a binary state determining circuit 64 receiving the output of second extrinsic calculation stage 56. The operation of circuit 66 in SIHO circuit 64 will be set forth in greater detail hereinbelow.

The difference output at difference circuit 62 is applied to register 68 which applies the extrinsic value calculation to extrinsic memory 14 at 14b. As was mentioned hereinabove, local memory 20, in addition to storing the data, parity and extrinsic values, further stores the first extrinsic value address of extrinsic memory 14, this address being successively coupled through memory register 34 and time synchronizing registers 70, 72 and 74 to provide the location in extrinsic memory 14 where the extrinsic value calculation is to be stored, the memory location data being applied to extrinsic memory 14 at 14c.

Figure 2:
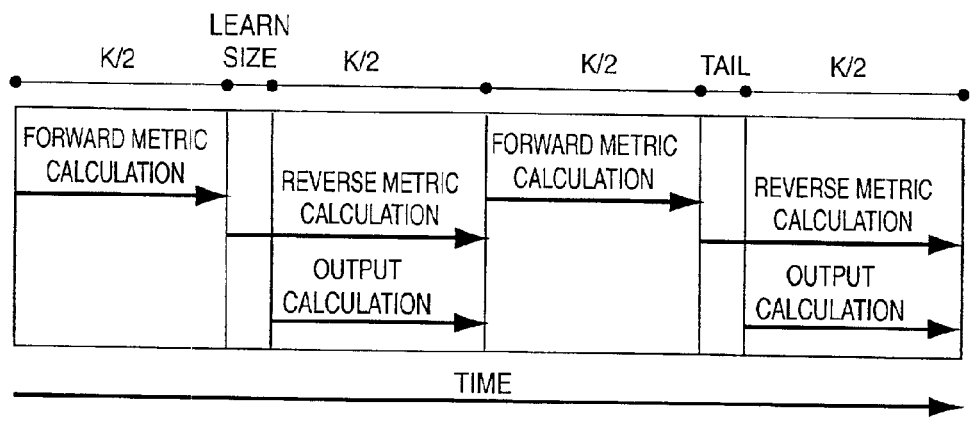
FIG. 2 is a second example of a time line of a prior art error correction algorithm architecture in which the forward and reverse metrics are calculated using sliding windows.

As was set forth hereinabove with reference to the example shown in FIG. 2, half of the calculations for determining alpha are performed during the first time window k/2.

Calculation of the reverse metrics (β) are performed during the last half (k/2) of the first window. Alpha values are read out from alpha memory 32 in the reverse order from which they are stored. The alpha values calculated during the forward metric for window 2 (see FIG. 4), are simultaneously stored into the memory location from which the alpha values calculated during window 1 are read out for purposes of calculating the extrinsic value, thereby reducing the memory capacity by one half, in the embodiment of FIG. 3. It should be noted that the newly calculated alpha values are stored in reverse order from those calculated during the first window.

In each subsequent pair of window calculations, the number of calculations performed being a function of the number of desired iterations for calculating the extrinsic value, the order of read out and write in of alpha values in alpha memory 32 is reversed so that, as previously calculated alpha values are read out stored in the order of last memory location to first, the alpha values are read out in the reverse order from first memory location to last and the alpha values determined in the window 2 of the second iteration for the forward metric, new values calculated at 24/26 are read in to those locations from which alpha values are being read out.

As was described hereinabove, when an extrinsic value has been calculated, i.e., upon the completion of the first iteration, this extrinsic value is read out of extrinsic memory 14 and is used during the calculations of the next iteration. Conventional control circuitry, not shown for purposes of simplicity, determines the number of iterations to be performed.

As was described hereinabove, as each extrinsic value is determined, it is applied to circuitry 66 which determines whether the data bit is a "1" or "0" by examining its amplitude, and when above a certain threshold is determined to be a "1" and when below a certain threshold is determined to be a "0". This established value is applied to register 76 and is merged together with the extrinsic value memory location, derived from register 74 and applied to merge circuit 78. The output bit is written into a memory 84. The SIHO circuitry 64 writes each bit into a memory location in which each row is 16 bits wide. The merge circuit multiplexer 78, multiplexer circuit 80 and output memory read register 82 operate so as to utilize all 16 binary bits of each memory location by storing 16 data bits evaluated by the binary state determining circuit 66.

Figure 1:
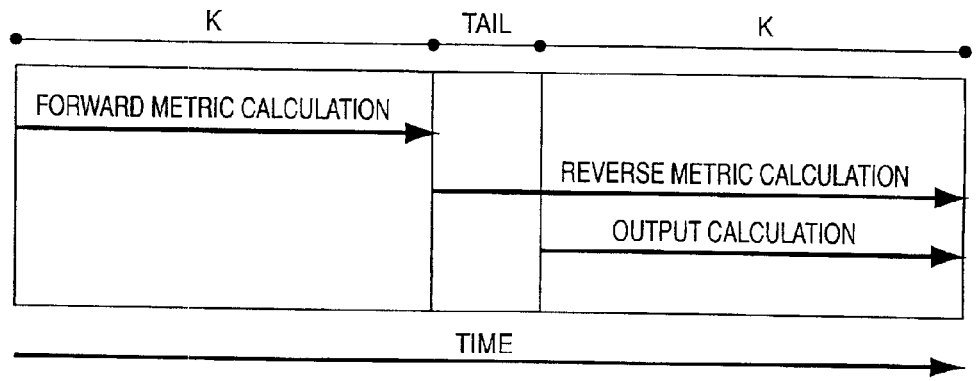
FIG. 1 is one example of a time line of a prior art error correction algorithm architecture.
Figure 3A:
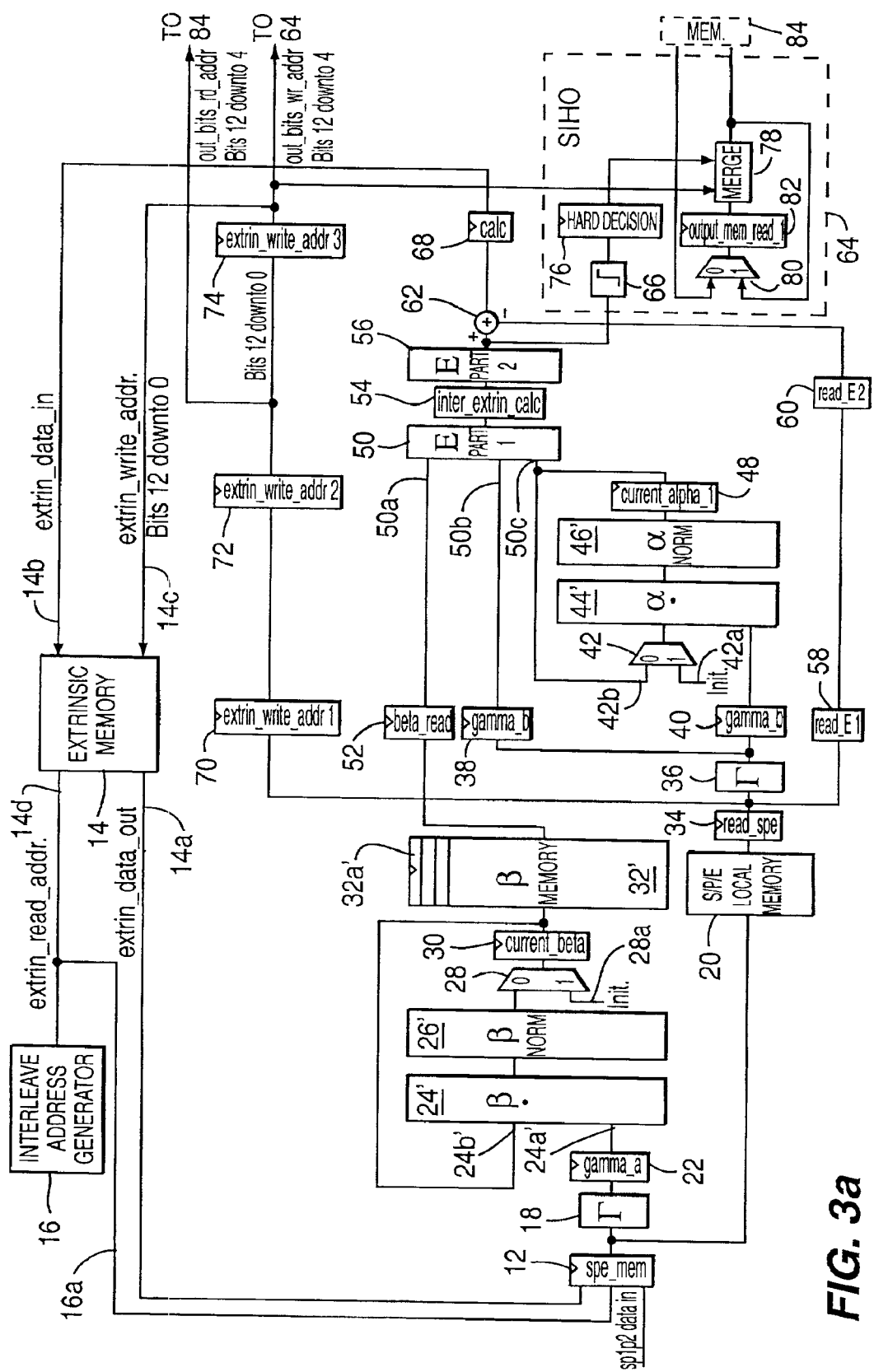
FIG. 3a is a block diagram of an alternative turbo decoder wherein the calculations of the forward and reverse metrics are reversed.

Although the embodiment shown in FIG. 3 teaches an implementation in which alpha is calculated during the first window and beta is calculated during the latter portion of the first window, it should be understood that the alpha and beta calculations may be reversed, as shown in FIG. 3a, while still deriving all the benefits of the embodiment shown in FIG. 1, namely the significantly reduction in calculation time as well as a 50% reduction in the memory requirements for the turbo decoder of FIG. 3 as compared with present day techniques and apparatus. The architecture of the present invention enables further reductions in memory size. For example, the data may be processed using three (3) windows, four (4) windows, etc, which provide further reductions in memory size. For example, using four (4) windows results in a memory size that is 3 the memory size compared to processing where no windowing is employed.

FIG. 4 also illustrates how the pipeline calculations would be performed if the data were divided into two windows. Neglecting the size of the learning windows and number of tail bits, the latency through the pipeline sliding window decoder in this example is proportional to 1½ K as opposed to 2 K in the simple sliding window architecture. Latency can be reduced by changing the window size, number of windows, and learning size according to the amount of data that needs to be processed.

Although the above-described architecture was developed for a turbo decoder, all convolution codes can use an MAP decoder. The calculation of the forward metrics may be calculated before or after the reverse metrics. The reverse metrics could be calculated first, and then the forward metrics can be calculated while the output calculations are performed. This can be accomplished as shown, for example, by the embodiment of FIG. 3a wherein calculation block $24^1$ is a beta calculator; calculation block $26'$ is a beta normalization calculation block, memory $32^1$ is a beta memory; calculation block $44^1$ is an alpha calculation block and calculation block $46^1$ is an alpha normalization calculation block.

The operation of the embodiment of FIG. 3a is otherwise substantially the same as the embodiment of FIG. 3.

What is claimed is:

1. A method employed by a decoder for calculating forward and reverse metrics required for performing an output calculation to accurately determine binary states of received signals, comprising the steps of:
    (a) performing the forward metric calculations in two stages, wherein a first group of the forward metric calculations are calculated in a first stage followed by a second group of forward metric calculations being calculated in a second stage;
    (b) storing the metric calculations obtained in step (a) in a memory;
    (c) reading the forward metrics calculated during the first stage from the memory for use with reverse metric values to perform the an output calculation;
    (d) performing the reverse metric calculations in the second stage, following the first stage;
    (e) performing a second half of forward metric calculations as said reverse calculations are being performed; and
    (f) storing each of the forward metric calculations performed in the second stage into a memory location of said memory that a forward metric calculated during the first stage is being read out for use in an output calculation.

2. The method of claim 1 further comprising the step of performing output calculations utilizing the forward metrics calculated in the first stage and the reverse metrics calculated in the second stage.

3. The method of claim 1 wherein step (f) is performed employing a common clock edge of a clock signal.

4. The method of claim 2 further comprising performing reverse metrics in a third stage following said second stage for use with the forward metrics calculated in the second stage for performing output calculations utilizing the forward metrics calculated during the second stage and the reverse metrics calculated during the third stage.

5. A method employed by a decoder for decoding a transmission received from a remote location which includes data bits and associated parity bits, comprising the steps of;
    (a) calculating, during a first time interval, a forward metric value for each data bit and its accompanying parity bits received from a transmission location;
    (b) storing each forward metric value in a first memory;
    (c) storing each received data bit and accompanying parity bits in a local memory as they are received;
    (d) reading out a forward metric value from the first memory during a second time interval for calculating an extrinsic value;
    (e) utilizing the data bit and associated parity bits previously stored in memory for calculating a reverse metric value during said second time interval; and
    (f) during said second time interval, calculating a forward metric value for data bits and associated parity bits received during the second time interval and storing each forward metric value calculated during the second time interval in a memory location of said first memory from which a forward metric value is read out during step (d).

6. The method of claim 5 wherein the data bit and associated parity bits read into the local memory during step (c) are read out of the local memory in reverse order for use in calculating the reverse metrics.

7. The method of claim 5 wherein the calculated forward metric values are read out of memory in reverse of the order in which the forward metric values are read into memory for use in calculating the extrinsic value.

8. The method of claim 5 wherein step (a) further comprises performing a gamma calculation on said data bit and associated parity bits prior to calculating a forward metric value during said first time interval.

9. The method of claim 5 further comprising calculating an initial extrinsic value based on a given forward metric value, a given reverse metric value and a given data bit associated parity bit.

10. The method of claim 9 wherein the extrinsic value is stored in an extrinsic memory.

11. The method of claim 10 further comprising the step of extracting the data bit and associated parity bits from the local memory; and performing a gamma calculation on the data bit and associated parity bits during the second time interval for use in the extrinsic value calculation.

12. The method of claim 11 further comprising subtracting a data bit and associated parity bits read out of the local memory during the second time interval from the initial extrinsic value to obtain a final extrinsic value.

13. The method of claim 11 further comprising determining a binary state of the output data of the extrinsic value calculator to make a hard decision regarding the binary state; and
    storing the hard decision output in a memory.

14. The method of claim 9 wherein the step of storing the extrinsic value includes storing the intrinsic value in a memory location linked with the data bit utilized to calculate the extrinsic value being stored.

15. A method employed by a turbo decoder receiving data bits each accompanied by associated parity bits, comprising the steps of:
(a) performing forward metric calculations in two successive time intervals wherein one group of forward metric calculations are calculated in a first time interval followed by a second time interval;
(b) storing each of the forward metric calculations performed during the first interval in a memory;
(c) reading each forward metric value calculated during the first time interval from said memory for use together with a reverse metric value in calculating an extrinsic value;
(d) performing reverse metric calculations, during the second time interval and after completion of the forward metric calculations performed during the first time interval; and
(e) writing each forward metric value calculated during the second time interval into a memory location in said memory from which a forward metric value calculated during the first time interval is read out of memory.

16. A turbo decoder for calculating forward and reverse metrics required for performing a calculation to determine binary states of received signals comprising the method steps of:
(a) generating a memory location in an extrinsic memory;
(b) receiving signals comprising data bits and associated parity bits which may be corrupted by noise or the like;
(c) storing the data bit, associated parity bits, a memory location and a starting extrinsic value;
(d) calculating a first set of forward metric values based on said data bit, associated parity bits and starting extrinsic value;
(e) storing the forward metric value calculated into a forward metric memory;
(f) reading the calculated forward metric value from memory for use together with a reverse metric value in calculation of an extrinsic value;
(g) employing steps (a)–(c) for calculating a second set of forward metric values while the reverse metric values are being calculated; and
(h) storing each of the second set of forward metric values in a memory location which is the same one in which one of the first set of forward metric values is read out for use in calculation of a reverse metric value.

17. The method of claim 16 further comprising;
reading the forward metric values out of memory in reverse order from which they were read into memory for calculation of reverse metric values.

18. A turbo decoder for calculating forward metrics ($\alpha$) and reverse ($\beta$) metrics required for performing a calculation to determine binary states of received signals comprising the method steps of:
(a) receiving signals comprising data bits each having associated parity bits, which signals may be corrupted by noise or the like;
(b) generating a memory location in an extrinsic memory for storing an extrinsic value;
(c) storing a first data bit, associated parity bits, memory location and a starting extrinsic value in a first memory;
(d) calculating a first forward metric value based on said data bit, associated parity bits and starting extrinsic value;
(e) storing the forward metric value calculated in a forward metric memory;
(f) reading the calculated forward metric value from the forward metric memory for use together with a reverse metric in calculating an extrinsic value;
(g) employing steps (a)–(c) for calculating a first forward metric value of a second set of forward metric values while the reverse metric value is being calculated; and
(h) storing the first forward metric value of the second set of forward metric values in the same memory location as one in which one of the first set of forward metric values is read out for use in calculation of an extrinsic value.

19. A turbo decoder for calculating forward and reverse metrics required for performing a calculation to determine binary states of received signals comprising:
an extrinsic memory;
first means for generating a memory location in the extrinsic memory;
second means for receiving signals comprising data bits each having associated parity bits which may be corrupted by noise or the like;
third means for storing the data bit, associated parity bits and memory location;
fourth means for calculating a first set of forward metric values based on said data bit, associated parity bits and an initial starting extrinsic value;
fifth means for storing the forward metric calculated in a forward metric memory;
sixth means for reading the calculated forward metric from said forward metric memory for use, together with a reverse metric, in calculating an extrinsic value;
said first, second and third means calculating a second set of forward metric values while the reverse metric values are being calculated; and
said fifth means including means for storing one of the second set of forward metric values in the same memory location of the forward metric memory as one in which one of the first set of forward metric values is read out for use in calculation of an extrinsic value.

20. A storing method for use in a turbo decoder for calculating forward and reverse metrics required for performing a calculation to determine binary states of received signals comprising the steps of:
(a) storing a first group of forward metric values in said memory in a given order;
(b) reading out stored metric values in an order of last calculated to first calculated; and
(c) storing a second group of forward metric values in a given order, whereby a first calculated forward metric value of said second group is stored in a memory location from which the last calculated metric value of said second group is read out.

21. The storing technique of claim 20 further comprising:
calculating a reverse metric value based on the forward metric value read out of memory.

22. Apparatus for use in a turbo decoder for calculating forward and reverse metrics required for performing a calculation to determine binary states of received signals comprising:
a first memory for storing a data bit and associated parity bits;
a forward metric memory;
means for calculating a first group of forward metric values based on said data bit and associated parity bits;

means for storing said first group of forward metric values in said memory in a given order;

means for reading out the first group of stored metric values from said memory in an order of last calculated to first calculated;

means for controlling said means for calculating to calculate a second group of forward metric values following calculation of said first group of metric values; and means for storing the second group of forward metric values in a given order in said forward metric memory, whereby a first calculated forward metric value of said second group is stored in a memory location in which the last calculated metric value of said first group is read out.

23. The apparatus of claim 22 further comprising:

second means for calculating, during calculation of said first group of forward metric values, a reverse metric value based on the data bit and associated parity bits read out of said first memory.

24. A method employed by a decoder for calculating forward and reverse metrics required for performing an output calculation to determine binary states of received signals, comprising the steps of:

(a) performing the reverse metric calculations in two stages, wherein one group of reverse metric calculations are calculated in a first stage followed by a second group of reverse metric calculations being calculated in a second stage;

(b) storing each of the reverse metric calculations performed in the first stage;

(c) reading the reverse metric values calculated during the first stage from memory for use in the output calculation;

(d) performing the forward metric calculations after completion of the first stage of reverse metric calculations and before the second stage of reverse metric calculations; and (e) writing each reverse metric calculated during the second stage into a memory location that a reverse metric calculated during the first stage is being read out for use in an output calculation.

25. The method of claim 24 further comprising the step of performing output calculations utilizing the reverse metrics calculated in the first stage and the forward metrics calculated in the second stage.

26. The method of claim 24 wherein steps (c) and (e) are performed employing a common clock edge of a clock signal.

27. The method of claim 25 further comprising performing forward metrics in a third stage following said second stage responsive to the reverse metrics calculated in the second stage; and performing output calculations utilizing the reverse metric values calculated during the second stage and the forward metric values calculated during the third stage.

28. A method employed by a decoder for decoding a transmission received from a remote location which includes data bits and associated parity bits, comprising the steps of:

(a) calculating, during a first time interval, a reverse metric value for each data bit and its accompanying parity bits received from a transmission location;

(b) storing each reverse metric value in a first memory;

(c) storing each received data bit and accompanying parity bits in a local memory as they are received;

(d) reading out a reverse metric value from the first memory for use in calculating an extrinsic value;

(e) utilizing the data bit and associated parity bits previously stored in the local memory for calculating a forward metric value; and (f) during a second time interval, calculating a reverse metric value for data bits and associated parity bits received during the second time interval and storing each reverse metric value calculated during the second time interval in a memory location of the first memory in which a reverse metric value is read out during step (d).

29. The method of claim 28 wherein the data bit and associated parity bits read into the local memory during step (c) are read out of the local memory in reverse order for use in calculating the extrinsic value.

30. The method of claim 29 wherein the reverse metric values calculated in the first time interval are read out of memory in reverse of the order in which the reverse metric values calculated in the second time interval are read into memory.

31. The method of claim 29 further comprising calculating an extrinsic value based on a given forward metric value, a given reverse metric value and a given data bit and associated parity bits.

32. A method employed by a decoder for calculating forward and reverse metrics required for performing calculations to determine binary states of received signals, comprising:

(a) performing a first group of forward metric calculations during a first stage;

(b) storing the first group of forward metric values in a memory;

(c) performing reverse metric calculations during a second stage following said first stage;

(d) performing a second group of forward metric calculations as reverse metric values are calculated during the second stage;

(e) reading forward metric values of said first group out of locations in memory for use with the reverse metric values calculated during said second stage for performing calculations to determine binary states of said received signals; and (f) storing calculations of said second group of forward metric values during a time that the reverse metric values are being calculated in the second stage, whereby each forward metric value calculated during the second stage is stored in the same location that a forward metric value calculated during the first stage is being read out for use in performing calculations to determine binary states of said received signals.

33. Apparatus for calculating forward and reverse metrics required for performing an output calculation to determine binary states of received signals, comprising:

means for performing the reverse metric calculations in two stages, wherein one group of reverse metric calculations are calculated in a first stage followed by a second group of reverse metric calculations being calculated in a second stage;

means for storing each of the reverse metric calculations performed in the first stage;

means for reading the reverse metric values calculated during the first stage from memory for use in the output calculation;

means for performing the forward metric calculations after completion of the first stage of reverse metric calculations and before the second stage of reverse metric calculations; and means for writing each reverse metric calculated during the second stage into a memory location that a reverse metric calculated during the first stage is being read out for use in an output calculation.

34. The apparatus of claim 33 further comprising means for performing output calculations utilizing the reverse metrics calculated in the first stage and the forward metrics calculated in the second stage.

35. The apparatus of claim 33 further comprising means for performing forward metrics in a third stage following said second stage responsive to the reverse metrics calculated in the second stage; and means for performing output calculations utilizing the reverse metric values calculated during the second stage and the forward metric values calculated during the third stage.

36. Apparatus for decoding a transmission received from a remote location which includes data bits and associated parity bits, comprising:

means for calculating, during a first time interval, a reverse metric value for each data bit and its accompanying parity bits received from a transmission location;

a first memory for storing each reverse metric value;

a local memory for storing each received data bit and accompanying parity bits;

means for reading out a reverse metric value from the first memory for use in calculating an extrinsic value;

means for utilizing the data bit and associated parity bits previously stored in the local memory for calculating a forward metric; and means, during a second time interval, for calculating a reverse metric value for data bits and associated parity bits received during the second time interval and storing each reverse metric value calculated during the second time interval in a memory location of the first memory in which a reverse metric value is read out during step (d).

37. Apparatus of claim 36 including means for reading out of the local memory the data bit and associated parity bits read into the local memory in reverse order for use in calculating the extrinsic value by read-only means.

38. The apparatus of claim 37 further comprising means for calculating an extrinsic value based on a given forward metric value, a given reverse metric value and a given data bit and associated parity bits.

39. Apparatus for calculating forward and reverse metrics required for performing calculations to determine binary states of received signals, comprising:

means for performing a first group of forward metric calculations during a first stage;

memory means for storing the first group of forward metric values;

means for performing reverse metric calculations during a second stage following said first stage;

means for performing a second group of forward metric calculations as reverse metric values are calculated during the second stage;

means for reading forward metric values of said first group out of locations in said memory means for use with the reverse metric values calculated during said second stage for performing calculations to determine binary states of said received signals; and means for storing calculations of said second group of forward metric values during a time that the reverse metric values are being calculated in the second stage, whereby each forward metric value calculated during the second stage is stored in the same location in said memory means that a forward metric value calculated during the first stage is being read out for use in performing calculations to determine binary stages of said received signals.

* * * * *

UNITED STATES PATENT AND TRADEMARK OFFICE
CERTIFICATE OF CORRECTION

PATENT NO. : 6,961,921 B2  
DATED : November 1, 2005  
INVENTOR(S) : Hepler et al.

It is certified that error appears in the above-identified patent and that said Letters Patent is hereby corrected as shown below:

Column 5,  
Line 7, after "the", delete "significantly" and insert -- significant --.  
Line 14, after "is", delete "3" and insert -- 1/4 --.  
Line 33, after "block", delete "$24^1$" and insert -- 24' --.  
Line 35, after "memory", delete "$32^1$" and insert -- 32' --; and after "block", delete "$44^1$" and insert -- 44' --.  
Line 36, after "block", delete "$46^1$" and insert -- 46' --.  
Line 55, after "perform", delete "the".

Signed and Sealed this

Twenty-first Day of March, 2006

JON W. DUDAS  
*Director of the United States Patent and Trademark Office*